(12) United States Patent
Sumitomo et al.

(10) Patent No.: US 9,231,370 B2
(45) Date of Patent: Jan. 5, 2016

(54) GROUP III NITRIDE SEMICONDUCTOR LIGHT EMITTING DEVICE

(75) Inventors: Takamichi Sumitomo, Itami (JP); Takashi Kyono, Itami (JP); Masaki Ueno, Itami (JP); Yusuke Yoshizumi, Itami (JP); Yohei Enya, Itami (JP); Masahiro Adachi, Osaka (JP); Shimpei Takagi, Osaka (JP); Katsunori Yanashima, Kanagawa (JP)

(73) Assignees: Sumitomo Electric Industries, Ltd., Osaka-shi (JP); SONY CORPORATION, Tokyo (JP)

( * ) Notice: Subject to any disclaimer, the term of this patent is extended or adjusted under 35 U.S.C. 154(b) by 0 days.

(21) Appl. No.: 13/453,743

(22) Filed: Apr. 23, 2012

(65) Prior Publication Data

US 2013/0051417 A1    Feb. 28, 2013

(30) Foreign Application Priority Data

Aug. 26, 2011    (JP) .................. 2011-185196

(51) Int. Cl.
*H01S 5/042* (2006.01)
*H01S 5/32* (2006.01)
*H01S 5/343* (2006.01)
(Continued)

(52) U.S. Cl.
CPC .............. *H01S 5/0425* (2013.01); *B82Y 20/00* (2013.01); *H01S 5/3202* (2013.01); *H01S 5/34333* (2013.01); *H01S 5/0202* (2013.01); *H01S 5/028* (2013.01); *H01S 5/22* (2013.01)

(58) Field of Classification Search
CPC .................................................. H01S 5/0425

USPC .................... 372/29.013, 38.05, 87
See application file for complete search history.

(56) References Cited

U.S. PATENT DOCUMENTS

2008/0198886 A1* 8/2008 Michiue et al. .......... 372/44.011
2010/0034231 A1* 2/2010 Fukuda et al. ............. 372/49.01
2010/0322276 A1* 12/2010 Yoshizumi et al. ...... 372/44.011

FOREIGN PATENT DOCUMENTS

CN    101984774 A    3/2011
JP    06-275867    9/1994
(Continued)

OTHER PUBLICATIONS

"Edge" definition from Merriam-Webster's Dictionary, Sep. 19, 2013.*

(Continued)

*Primary Examiner* — Tod T Van Roy
(74) *Attorney, Agent, or Firm* — Venable LLP; Michael A. Sartori; Tamatane J. Aga

(57) ABSTRACT

A group III nitride semiconductor laser device includes a laser structure, an insulating layer, an electrode and dielectric multilayers. The laser structure includes a semiconductor region on a semi-polar primary surface of a hexagonal group III nitride semiconductor support base. The dielectric multilayers are on first and second end-faces for the laser cavity. The c-axis of the group III nitride tilts by an angle ALPHA from the normal axis of the primary surface in the waveguide axis direction from the first end-face to the second end-faces. A pad electrode has first to third portions provided on the first to third regions of the semiconductor regions, respectively. An ohmic electrode is in contact with the third region through an opening of the insulating layer. The first portion has a first arm, which extends to the first end-face edge. The third portion is away from the first end-face edge.

20 Claims, 11 Drawing Sheets

(51) Int. Cl.
*B82Y 20/00* (2011.01)
*H01S 5/02* (2006.01)
*H01S 5/028* (2006.01)
*H01S 5/22* (2006.01)

(56) References Cited

FOREIGN PATENT DOCUMENTS

| JP | 07-147453 | 6/1995 |
|----|-----------|--------|
| JP | 08-340156 | 12/1996 |
| JP | 11-354888 | 12/1999 |
| JP | 2003-258370 | 9/2003 |
| JP | 2006-203171 | 8/2006 |
| JP | 2007-266575 | 10/2007 |
| JP | 2010-028020 | 2/2010 |
| JP | 4475357 | 6/2010 |
| JP | 2011-003660 | 1/2011 |
| JP | 2011-146653 A | 7/2011 |
| WO | WO-01/41223 A1 | 6/2001 |
| WO | WO-2010/146723 A1 | 12/2010 |
| WO | WO-2011/086854 A1 | 7/2011 |

OTHER PUBLICATIONS

International Preliminary Report on Patentability and Written Opinion in PCT International Application No. PCT/JP2012/060166, dated Mar. 13, 2014.

Notification of First Office Action in Chinese Patent Application No. 201280041775.2 dated Jun. 24, 2015.

* cited by examiner (a)

(b)

(a)

(b)

GROUP III NITRIDE SEMICONDUCTOR LIGHT EMITTING DEVICE

BACKGROUND OF THE INVENTION

1. Field of the Invention

The present invention relates to a group III nitride semiconductor laser device.

2. Related Background Art

Patent Literature 1 discloses a nitride-based semiconductor laser device. The semiconductor laser device in Patent Literature 1 enables the easy detection of defects caused in the device by cleaving without an increased number of steps in the manufacturing process. The nitride-based semiconductor laser device includes nitride-based semiconductor layers formed on a c-plane n-type GaN substrate, a light-emitting face of a fractured face, and p-side pad electrode formed on the nitride-based semiconductor layers. The p-side pad electrode includes a notch formed so as not to cover a ridge at the end section in which the light-emitting face 30a is located. The p-side pad electrode is disposed away from the edge of the light-emitting face.

Patent Literature 2 discloses a nitride-based semiconductor laser device disposed on a semi-polar surface of a substrate. The end faces of an optical cavity in the nitride-based semiconductor laser device are not formed by cleaving.

Patent Literature 1: Japanese Unexamined Patent Application Publication No. 2010-28020

Patent Literature 2: Japanese Patent No. 4475357

SUMMARY OF THE INVENTION

The inventors have some knowledge that in a group III nitride semiconductor laser device having a pad electrode the side of which extending to the edge of an end face of an optical cavity, abnormal growth of a dielectric material may occur at the side of the pad electrode in the formation of a dielectric multilayer on the end face. A group III nitride semiconductor laser device in which the entire side of a pad electrode is located away from the edges of the end faces of the optical cavity so as to prevent abnormal growth has immunity against catastrophic optical damage (COD).

According to a study conducted by the inventors, the heat generated near a light-emitting face is dissipated through the pad electrode during laser operation. But, as described above, abnormal growth of the dielectric material, however, may occur at the side of the pad electrode extending to the end face. In addition, since the end faces of an optical cavity are not formed by cleaving in the nitride-based semiconductor laser device described in Patent Literature 2, abnormal growth is likely to be caused due to these end faces (which are not fractured faces). Thus, there is a need for preventing abnormal growth of a dielectric material at a side of the pad electrode and preventing the trigger of abnormal growth due to other causes.

It is an object of one aspect of the present invention to provide a group III nitride semiconductor laser device having a structure enabling reduction in occurrence of malfunctions due to COD and reduction in lowering of heat dissipation capability.

A group III nitride semiconductor laser device according to one aspect of the present invention comprises: a laser structure including a support base and a semiconductor region, the support base having a semi-polar primary surface and comprising a hexagonal group III nitride semiconductor, the semiconductor region being provided on the semi-polar primary surface of the support base, the laser structure having first and second end faces for a laser cavity of the group III nitride semiconductor laser device; an insulating layer provided on the semiconductor region of the laser structure; an electrode provided on the semiconductor region of the laser structure and the insulating layer; and a dielectric multilayer provided on each of the first end face and the second end face. A c-axis of the hexagonal group III nitride semiconductor of the support base is inclined from a normal axis of the semi-polar primary surface by an angle ALPHA in a direction of a waveguide axis, the waveguide axis extending from the first end face to the second end face; the semiconductor region includes a first region, a second region, and a third region, the first to third regions extending in the direction of the waveguide axis; the third region is provided between the first region and the second region; the third region of the semiconductor region includes a first cladding layer, a second cladding layer and an active layer, the first cladding layer comprising a first conductivity type gallium nitride-based semiconductor, the second cladding layer comprising a second conductivity type of gallium nitride-based semiconductor, and the active layer provided between the first cladding layer and the second cladding layer; the insulating layer has an opening on the third region of the semiconductor region; the electrode includes an ohmic electrode and a pad electrode; the ohmic electrode is in contact with the third region of the semiconductor region through the opening of the insulating layer; the pad electrode has a first electrode portion, a second electrode portion and a third electrode portion, the first electrode portion being provided on the first region, the second electrode portion being provided on the second region, and the third electrode portion being provided on the third region; the first electrode portion has a first arm; and the first arm extends to an edge of the first end face, and the third electrode portion being is provided away from the edge of the first end face.

The electrode of the group III nitride semiconductor laser device includes an ohmic electrode and a pad electrode. The ohmic electrode is in contact with the third region in the semiconductor region through the opening of the insulating layer. The pad electrode includes first, second and third electrode portions provided on first, second and third regions of the semiconductor region, respectively. The first arm of the first electrode portion extends to the edge of the first end face in the group III nitride semiconductor laser device. Thus, heat can be dissipated through the pad electrode in the first region adjoining the third region of the semiconductor region. The main operation of the laser is in the third region of the semiconductor region, which extends to the first end face. The third electrode portion is disposed away from the edge of the first end face. This structure can reduce the occurrence of abnormal growth of dialectic material at the end face of the pad electrode at the end section of the third region of the semiconductor region.

In the group III nitride semiconductor laser device according to the aspect of the present invention, the angle ALPHA may be within the range of 45 to 80 degrees or 100 to 135 degrees.

If the angle ALPHA is smaller than 45 degrees or larger than 135 degrees, the end face formed by pressing is likely to consist of the m-plane. If the angle ALPHA is in the range of 80 to 100 degrees, the end face may not have desirable flatness or perpendicularity.

In the group III nitride semiconductor laser device according to the aspect of the present invention, the laser structure may have a first surface and a second surface, the first surface opposing the second surface, and the first end face and the second end face may extend from an edge of the first surface to an edge of the second surface.

The c-axis of the hexagonal group III nitride semiconductor of the group III nitride semiconductor laser device is inclined by an angle greater than zero with respect to the normal axis in the direction of the waveguide axis. Thus, the first and second end faces, which are not formed by cleaving, extend from the edge of the first surface to the edge of the second surface of the laser structure.

In the group III nitride semiconductor laser device according to the aspect of the present invention, it is preferable that the first cladding layer, the second cladding layer and the active layer be disposed in the direction of the normal axis of the semi-polar primary surface and that the third region of the semiconductor region have a ridge extending along the waveguide axis from the first end face to the second end face.

Current from the electrode in the group III nitride semiconductor laser device is guided through the ridge to a portion of the semiconductor region which extends along the waveguide axis. Preferably, the third electrode portion is aligned with the part of the end face which the ridge reaches.

In the group III nitride semiconductor laser device according to the aspect of the present invention, preferably, the angle ALPHA is within the range of 63 to 80 degrees or 100 to 117 degrees.

The end face of the group III nitride semiconductor laser device formed by pressing is more likely substantially orthogonal to the substrate primary surface where the angle ALPHA is in the range of 63 to 80 degrees or 100 to 117 degrees. If the angle ALPHA is between 80 and 100 degrees, the end face may not have desirable flatness or perpendicularity. However, an end face with desirable flatness and perpendicularity is not as flat as cleavage faces, and depends upon a laminate structure of the semiconductor region epitaxially grown on the semi-polar surface. Thus, the end face for the cavity may bend at the boundary of semiconductor layers of the semiconductor region, and such microscopic roughness of the end face applies stress to the dielectric multilayer grown on the end face. The layer with such quality is susceptible to heat. Thus, heat dissipation through a pad electrode structure is effective in improving COD resistance. The electrode has an opening in the third region of the semiconductor which forms a notch depressed in the direction of the waveguide, thereby reducing the occurrence of abnormal growth of the dielectric multilayer on the end face near the optical waveguide.

In the group III nitride semiconductor laser device according to the aspect of the present invention, preferably, the support base has a thickness of 400 μm or smaller. The group III nitride semiconductor laser device is suitable for acquiring a high-quality fractured face for the laser cavity.

In the group III nitride semiconductor laser device according to the aspect of the present invention, preferably, the support base has a thickness within the range of 50 to 100 μm. A thickness of 50 μm or greater of the support base of the group III nitride semiconductor laser device facilitate handling and thus improves the production yield. A thickness of 100 μm or smaller of the support base is suitable for production of excellent fractured faces for the laser cavity.

In the group III nitride semiconductor laser device according to the aspect of the present invention, preferably, the semi-polar primary surface is displaced from one of a (20-21) plane, a (10-11) plane, a (20-2-1) plane, and a (10-1-1) plane by an angle in the range of −4 to +4 degrees.

In the group III nitride semiconductor laser device, by use of a surface slightly tilting from such a typical semi-polar surface, the first and second end faces can be provided with flatness and perpendicularity sufficient to serve as a laser cavity.

In the group III nitride semiconductor laser device according to the aspect of the present invention, preferably, the semi-polar primary surface comprises one of a (20-21) plane, a (10-11) plane, a (20-2-1) plane and a (10-1-1) plane.

In the group III nitride semiconductor laser device, by use of such a typical semi-polar surface, the first and second end faces can be provided with flatness and perpendicularity sufficient to serve as a laser cavity.

In the group III nitride semiconductor laser device according to the aspect of the present invention, preferably, the support base comprises one of GaN, AlGaN, AlN, InGaN, and InAlGaN.

In the group III nitride semiconductor laser device, the first and second end faces that are usable as the cavity can be formed on a substrate composed of a gallium nitride-based semiconductor. The use of an AlN or AlGaN substrate increases the polarization degree and enhances optical confinement due to a small refractive index. The use of an InGaN substrate reduces lattice mismatch between the substrate and the light-emitting layer and increases the crystal quality.

In the group III nitride semiconductor laser device according to the aspect of the present invention, preferably, the active layer includes a gallium nitride-based semiconductor layer, and the active layer includes a light-emitting region emitting light having a wavelength of 500 nm or longer.

In order to generate light with a wavelength of 500 nm or longer, the group III nitride semiconductor laser device includes an InGaN layer of the active layer an indium content of which is 0.2 or more. InGaN with a high indium content has a large lattice constant, and the InGaN layer includes lattice strain. An increase in stress in the active layer and the peripheral semiconductor layers may prevent the end faces from extending straight in fracturing performed to form the end faces for the optical cavity. Such bending may cause three-dimensional nucleation at the edge of the pad electrode, triggering abnormal growth in a large area. Since abnormal growth triggered by the edge of the pad electrode is reduced in the third region used for main laser operation, the bending in the end faces of the optical cavity are less likely to lead to abnormal growth of the dielectric material.

In the group III nitride semiconductor laser device according to the aspect of the present invention, preferably, the c-axis of the hexagonal group III nitride semiconductor of the support base is inclined toward an m-axis of the hexagonal group III nitride semiconductor.

In the group III nitride semiconductor laser device, the first end face for the laser cavity intersects an m-n plane defined by the normal axis and the m-axis of the hexagonal group III nitride semiconductor, a laser waveguide extending in the direction of the intersection of the m-n plane with the semi-polar surface can be provided, thereby providing a group III nitride semiconductor laser device having a laser cavity achieving a low-threshold current.

In the group III nitride semiconductor laser device according to the aspect of the present invention, preferably, an end face of the support base and an end face of the semiconductor region are exposed at both the first and second end faces, and the angle formed between an end face of the active layer of the semiconductor region and a reference plane orthogonal to an m-axis of the support base of the hexagonal group III nitride semiconductor is in the range of (ALPHA−5) to (ALPHA+5) on the first plane defined by the c-axis and the m-axis of the hexagonal group III nitride semiconductor.

The group III nitride semiconductor laser device has an end face having perpendicularity regarding an angle in the plane defined by the c-axis and the m-axis.

In the group III nitride semiconductor laser device according to the aspect of the present invention, preferably, the angle is in the range of −5 to +5 degrees on the second plane orthogonal to the first plane and the normal axis. The group III nitride semiconductor laser device has an end face having perpendicularity regarding an angle defined along a plane orthogonal to the normal axis of the semi-polar surface.

In the group III nitride semiconductor laser device according to the aspect of the present invention, preferably, the second electrode portion has a second arm, and the second arm extends to an edge of the first end face.

In the group III nitride semiconductor laser device, not only the first arm but also the second arm of the second electrode portion is provided near the end face. These arms facilitate heat dissipation.

In the group III nitride semiconductor laser device according to the aspect of the present invention, preferably, the ohmic electrode comprises palladium.

The palladium electrode of the group III nitride semiconductor laser device establishes electrical contact even on a semi-polar plane having highly-reactive to oxygen.

In the group III nitride semiconductor laser device according to the aspect of the present invention, the first end face differs from cleavage faces, and the second end face differs from cleavage faces.

BRIEF DESCRIPTION OF THE DRAWINGS

The above-described object and other objects, features and advantages of the present invention will be apparent from the detailed description of the embodiments of the present invention with reference to the accompanying drawings.

DESCRIPTION OF THE PREFERRED EMBODIMENTS

The expertise of the present invention can be readily understood in view of the following detailed description with reference to the accompanying drawings provided by way of illustration only. A group III nitride semiconductor laser device and a method of fabricating a group III nitride semiconductor laser device according to embodiments of the present invention will now be described with reference to the accompanying drawings. The same portions will be denoted by the same reference symbols, if possible.

Figure 1:
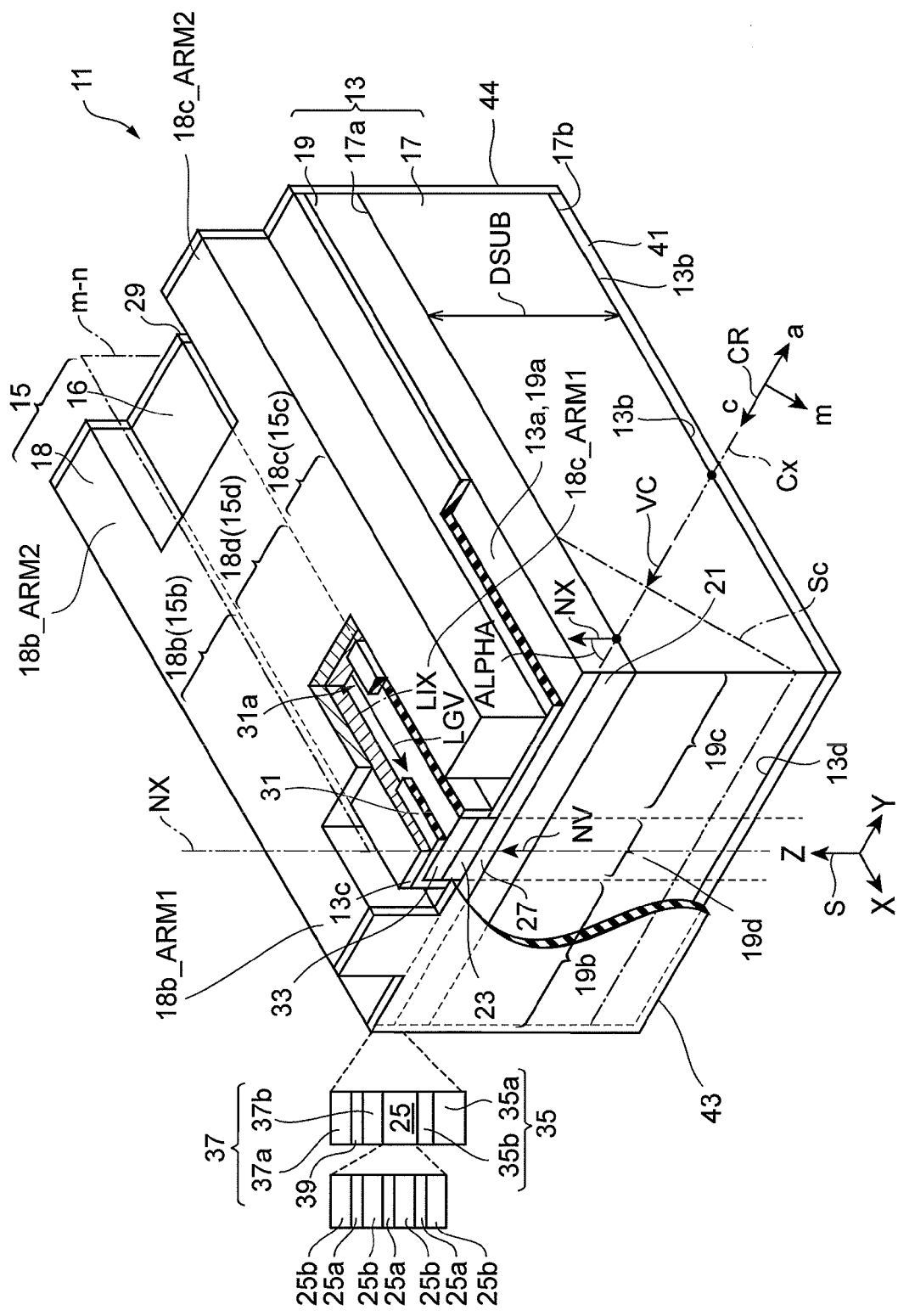
FIG. 1 is a schematic view of the structure of a group III nitride semiconductor laser device according to an embodiment.

FIG. 1 is a schematic view of the structure of the group III-nitride semiconductor laser device according to an embodiment. Although the group III nitride semiconductor laser device 11 has a ridge structure, the group III nitride semiconductor laser device 11 according to an embodiment of the present invention is not limited to ridge structures. The group III nitride semiconductor laser device 11 includes a laser structure 13 and an electrode 15. The laser structure 13 has a support base 17 and a semiconductor region 19. The support base 17 comprises a hexagonal group III nitride semiconductor and has a semi-polar front face 17a and a back face 17b. The semiconductor region 19 is provided on the semi-polar front face 17a of the support base 17. The electrode 15 is provided on the semiconductor region 19 of the laser structure 13. The semiconductor region 19 includes a first cladding layer 21, a second cladding layer 23, and an active layer 25. The first cladding layer 21 comprises a first conductivity type of gallium nitride based semiconductor, such as n-type AlGaN or n-type InAlGaN. The second cladding layer 23 comprises a second conductivity type of gallium nitride-based semiconductor, for example p-type AlGaN or p-type InAlGaN. The active layer 25 is provided between the first cladding layer 21 and the second cladding layer 23. The active layer 25 includes a gallium nitride-based semiconductor layer, which is provided for, for example, one or more well layers 25a. The active layer 25 also has barrier layers 25b, which comprise gallium nitride-based semiconductor. The well layers 25a and the barrier layers 25b are alternately arranged. The well layers 25a comprise, for example, InGaN, and the barrier layers 25b comprise, for example, GaN or InGaN. The active layer 25 may have a light-emitting region that emits light in a wavelength range of, for example, 360 to 600 nm. The first cladding layer 21, the second cladding layer 23, and the active layer 25 are arranged along a normal axis NX of the semi-polar primary surface 17a. The laser structure 13 has a first fractured face 27 and a second fractured face 29 for an optical cavity. The c-axis of the hexagonal group III nitride semiconductor of the support base 17 is inclined by an angle ALPHA in the direction of a waveguide axis extending from the first fractured face 27 to the second fractured face 29 from the normal axis NX of the semi-polar primary surface 17a.

The group III nitride semiconductor laser device 11 includes an insulating layer 31. The insulating layer 31 covers the surface 19a of the semiconductor region 19 of the laser structure 13. The semiconductor region 19 is provided between the insulating layer 31 and the support base 17. The first and second fractured faces 27, 29 of the laser structure 13 intersect the m-n plane defined by the m-axis of the hexagonal group III nitride semiconductor and the normal axis NX. One of the edges of the insulating layer 31 extends to the first fractured face 27 and another edge of the insulating layer 31 extends to the second fractured face 29. The support base 17 comprises a hexagonal group III nitride semiconductor. The insulating layer 31 has an opening 31a, and the opening 31a extends in the direction of the intersecting line LIX of the surface 19a of the semiconductor region 19 and the m-n plane and has a shape of, for example, a strip. The electrode 15 is in contact with the surface 19a of the semiconductor region 19 (for example, a contact layer 33 of the second conductivity type) through the opening 31a and extends in the direction of the intersecting line LIX. The laser waveguide of the group III nitride semiconductor laser device 11 includes the first cladding layer 21, the second cladding layer 23, and the active layer 25 and extends in the direction of the intersecting line LIX.

The semiconductor region 19 has a first region 19b, a second region 19c, and a third region 19d, and the regions 19b, 19c, and 19d extend in the direction of the waveguide axis (an axis represented by a waveguide vector LGV). The waveguide axis extends from the first fractured face 27 to the second fractured face 29. The third region 19d is located between the first region 19b and the second region 19c. The opening 31a of the insulating layer 31 is positioned to the third region 19d of the semiconductor region 19. The third region 19d may include the ridge structure of the semiconductor region 19.

The electrode 15 includes an ohmic electrode 16 and a pad electrode 18. The ohmic electrode 16 is in ohmic contact with the third region 19d of the semiconductor region 19 through the opening 31a of the insulating layer 31. The pad electrode 18 has a first electrode portion 18b, a second electrode portion 18c, and a third electrode portion 18d, and the portions 18b, 18c, and 18d are provided on the first region 19b, the second region 19c, and the third region 19d of the semiconductor region 19, respectively. The ohmic electrode 16 may comprise, for example, Pd. A Pd electrode establishes electrical contact even on a semi-polar plane which has nature of highly-reactive to oxygen. The pad electrode 18 is composed of, for example, Ti/Pt/Au.

The first electrode portion 18b has a first arm 18b_ARM1, and the first arm 18b_ARM1 extends to the edge of the first fractured face 27. The third electrode portion 18d is located away from the edge 13c of the first fractured face 27. In this example, the second electrode portion 18c may have a second arm 18c_ARM1, and the second arm 18c_ARM1 extends to the edge of the first fractured face 27.

The first electrode portion 18b has another arm 18b_ARM2, and the other arm 18b_ARM2 extends to the edge of the second fractured face 29. The second electrode portion 18c has also another arm 18c_ARM2, and the other arm 18c_ARM2 extends to the edge of the second fractured face 29.

As illustrated in FIG. 1, the group III nitride semiconductor laser device 11 includes a dielectric multilayer 43 provided on the fractured face 27 and a dielectric multilayer 44 provided on the second fractured face 29. End face coating may be applied to the fractured faces 27 and 29. The end face coating enables adjustment of their reflectivity.

The dielectric multilayer 43 is provided on an end face of the support base 17 and an end face of the semiconductor region 19. The end faces constitute the first fractured face 27. Deposition for the dielectric multilayer 43 is also formed on an end face of the electrode 15 (pad electrode 18). The dielectric multilayer 44 is provided on the other end face of the support base 17 and the other end face of the semiconductor region 19. These end faces constitute the second fractured face 29. Deposition for the dielectric multilayer 44 is also formed on the other end face of the electrode 15 (pad electrode 18).

The electrode 15 of the group III nitride semiconductor laser device 11 includes the ohmic electrode 16 and the pad electrode 18. The ohmic electrode 16 is in contact with the third region 19d of the semiconductor region 19 through the opening 31a of the insulating layer 31. The pad electrode 18 includes a first electrode portion 15b, a second electrode portion 15c, and a third electrode portion 15d which are arranged over the first region 19b, the second region 19c, and the third region 19d of the semiconductor region 19, respectively. The first arm 18b_ARM1 in the first electrode portion 15b extends to the edge of the first region 19b of the group III-nitride semiconductor laser device 11. Thus, the first region 19b adjoining the third region 19d of the semiconductor region 19 can dissipate heat via the pad electrode 18. The third region 19d of the semiconductor region 19, which carries out the main operation of the laser, extends to the first fractured surface 27, and the third electrode portion 15d is positioned away from the edge of the first fractured face 27. This structure can reduce the occurrence of abnormal growth of dialectic material at the side of the pad electrode 18 at the end face 27 of the third region 19d.

The pad electrode 18 on the periphery of the ridge structure around the first fractured face 27 can prevent a temperature rise in the laser end face and the periphery due to heat dissipation from the arm of the pad electrode 18. This can reduce degradation of the end-face coating and prevent the occurrence of COD, thereby extending the life of the laser device.

The ohmic electrode 16 has a thickness between, for example, 20 and 100 nm, while the pad electrode 18 has a thickness between, for example, 0.2 and 1 µm. The dielectric multilayer 43 (and, similarly, the dielectric multilayer 44) is also grown over the end face of the electrode 15. Abnormal growth of a dielectric multilayer is likely to occur on the end face of the pad electrode 18 that has a thickness greater than that of the ohmic electrode 16. Thus, the pad electrode 18 cannot be formed on the ohmic electrode 16 that is positioned right above the partial region 19d of the semiconductor region 19 including the waveguide for lasing operation. The arm of the pad electrode 18 is disposed on at least one of the regions 19b and 19c, which adjoin the third region 19d, of the semiconductor region 19. The arm dissipates the heat generated in the third region 19d, which includes the waveguide for lasing operation.

Electric current from the electrode 15 is guided through the ridge structure to the semiconductor region 19d extending along the waveguide axis. The third electrode portion 18d is suitably positioned to the end face which the ridge structure reaches.

The pad electrode 18 has notches which separate the pad electrode 18 from the fractured faces 27 and 29 in the periphery of the ridge section. During end face coating by deposition of an oxide film to enhance the reflectivity, a flat dielectric multilayer is grown over a flat semiconductor surface, but a flat layer is not formed on the pad electrode 18 due to three-dimensional nucleation. A difference in quality (crystallinity and temperature characteristics) between the flat dielectric multilayer and the dielectric material grown on the end face of the pad electrode 18 induces cracking and separation of the coating film, which increase the possibility of defective operation of the device. A pad electrode according to this embodiment can inhibit three-dimensional nucleation around the ridge and its periphery where the temperature readily rises, thereby maintaining the quality of the coating film.

The active layer 25 may have a quantum well structure that emits light in wavelength band of 500 nm or longer. Use of a semi-polar plane is suitable for emitting light in a wavelength band of 500 to 550 nm.

In the group III nitride semiconductor laser device 11, the InGaN layer constituting the active layer 25 have an indium content of 0.2 or more so as to generate light of a wavelength of 500 nm or longer. InGaN with a high indium content has a large lattice constant, and thus the InGaN layer includes lattice strain. An increase in stress in the active layer 25 and the peripheral semiconductor layers may prevent the end faces 27 and 29 from straightening in fracturing performed to prepare the end faces 27 and 29 for the optical cavity. Such a bent end face may cause three-dimensional nucleation at the end face of the pad electrode 18, triggering abnormal growth in a large area. Since abnormal growth triggered by the end face of the pad electrode 18 is reduced in the third region 19d for main lasing operation, the bending in the end faces 27 and 29 of the optical cavity are less likely to lead to abnormal growth of the dielectric material.

FIG. 1 illustrates an orthogonal coordinate system S and a crystal coordinate system CR. The normal axis NX extends in the direction of the Z axis of the orthogonal coordinate system S. The semi-polar primary surface 17a extends parallel to a predetermined plane defined by the X and Y axes of the orthogonal coordinate system S. FIG. 1 also illustrates a typical c-plane Sc. The c-axis of the hexagonal group III nitride semiconductor of the support base 17 is inclined by an angle ALPHA, which is larger than zero degrees, with respect to the normal axis NX in the direction of the m-axis of the hexagonal group III nitride semiconductor.

In this embodiment, the first fractured face 27 and the second fractured face 29 of the group III nitride semiconductor laser device 11 intersect the m-n plane defined by the m-axis of the hexagonal group III nitride semiconductor and the normal axis NX. The laser cavity of the group III nitride semiconductor laser device 11 comprises the fractured faces 27 and 29, and the laser waveguide extends between the first fractured face 27 and the second fractured face 29. The laser structure 13 has a first surface 13a and a second surface 13b, and the first surface 13a opposes the second surface 13b. The fractured faces 27 and 29 extend from the edge 13c of the first surface 13a to the edge 13d of the second surface 13b. The fractured faces 27 and 29 differ from conventional cleavage surfaces, such as the c-plane, m-plane, and a-plane.

In the group III-nitride semiconductor laser device 11, the fractured faces 27 and 29, which constitute the laser cavity, intersect the m-n plane. Thus, the laser waveguide extends in the direction of the line of intersection of the m-n plane with the semi-polar primary surface 17a. Thus, the laser cavity of the group III nitride semiconductor laser device 11 can generate a low threshold current.

The group III nitride semiconductor laser device 11 includes an n-side optical guiding layer 35 and a p-side optical guiding layer 37. The n-side optical guiding layer 35 has a first portion 35a and a second portion 35b and is composed of, for example, GaN or InGaN. The p-side optical guiding layer 37 has a first portion 37a and a second portion 37b and is composed of, for example, GaN or InGaN. A carrier blocking layer 39 may be, for example, provided between the first portion 37a and the second portion 37b. Another electrode 41 is disposed on the back surface 17b of the support base 17. The electrode 41, for example, covers the back surface 17b of the support base 17.

Figure 2:
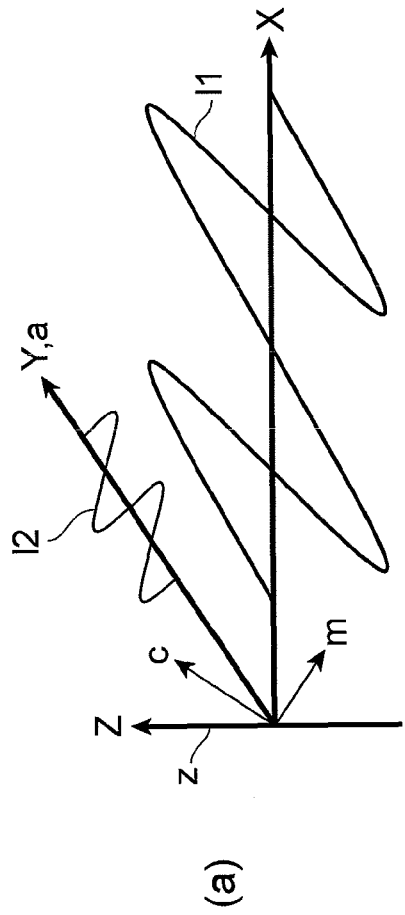
FIG. 2 is a drawing which illustrate the polarization of light emitted from an active layer of the group III nitride semiconductor laser device according to an embodiment.
Figure 2:
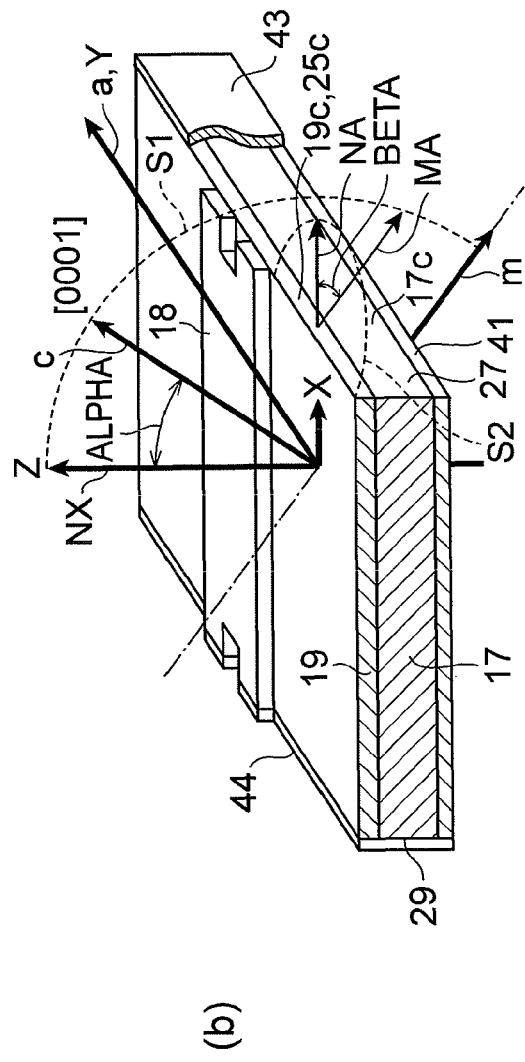

FIG. 2 illustrates the polarization of light emitted from the active layer 25 of the group III-nitride semiconductor laser device 11. The band structure of the active layer in the group III-nitride semiconductor laser device has three types of possible transition between the conduction band and the valence band near the Γ of the band structure BAND. The difference in energy between the band A and band B is relatively small. Light generated through the transition Ea from band A to the conductive band is polarized in the a-axis direction, and light generated through the transition Eb from band B to the conductive band is polarized in a direction of the c-axis projected onto the primary surface. Regarding lasing operation, the threshold of the transition Ea is smaller than the threshold of the transition Eb. As a result of such a band structure, an LED mode of the group III nitride semiconductor laser device 11 contains two spectra created from these optical transitions. When the polarization degree ρ is defined as (I1−I2)/(I1+I2), the light in LED mode contains a polarization component I1 in the direction of the a-axis of the hexagonal group III nitride semiconductor and a polarization component I2 in the direction of the projected c-axis of the hexagonal group III nitride semiconductor onto the primary surface, and the polarization component I1 is greater than the polarization component I2. This laser cavity of the group III nitride semiconductor laser device 11 enables the mode of higher intensity in LED mode to lase As illustrated in Part (a) of FIG. 2, laser light L from the active layer 25 is polarized in the direction of the a-axis of the hexagonal group III nitride semiconductor. Band transition that demonstrates a low threshold current in the group III nitride semiconductor laser device 11 has a polarization nature. The fractured faces 27 and 29 of the laser cavity differ from known cleavage surfaces, such as the c-plane, m-plane, and a-plane. The fractured faces 27 and 29 serve as mirrors for the cavity having flatness and perpendicularity. Thus, use of the fractured faces 27 and 29 and the laser waveguide extending between the fractured faces 27 and 29, as illustrated in Part (a) of FIG. 2, enables lasing with low threshold by use of the emission from the transition Ea which is stronger in intensity than the emission from the transition Eb and having polarization in the direction of the c-axis projected onto the primary surface.

Figure 3:
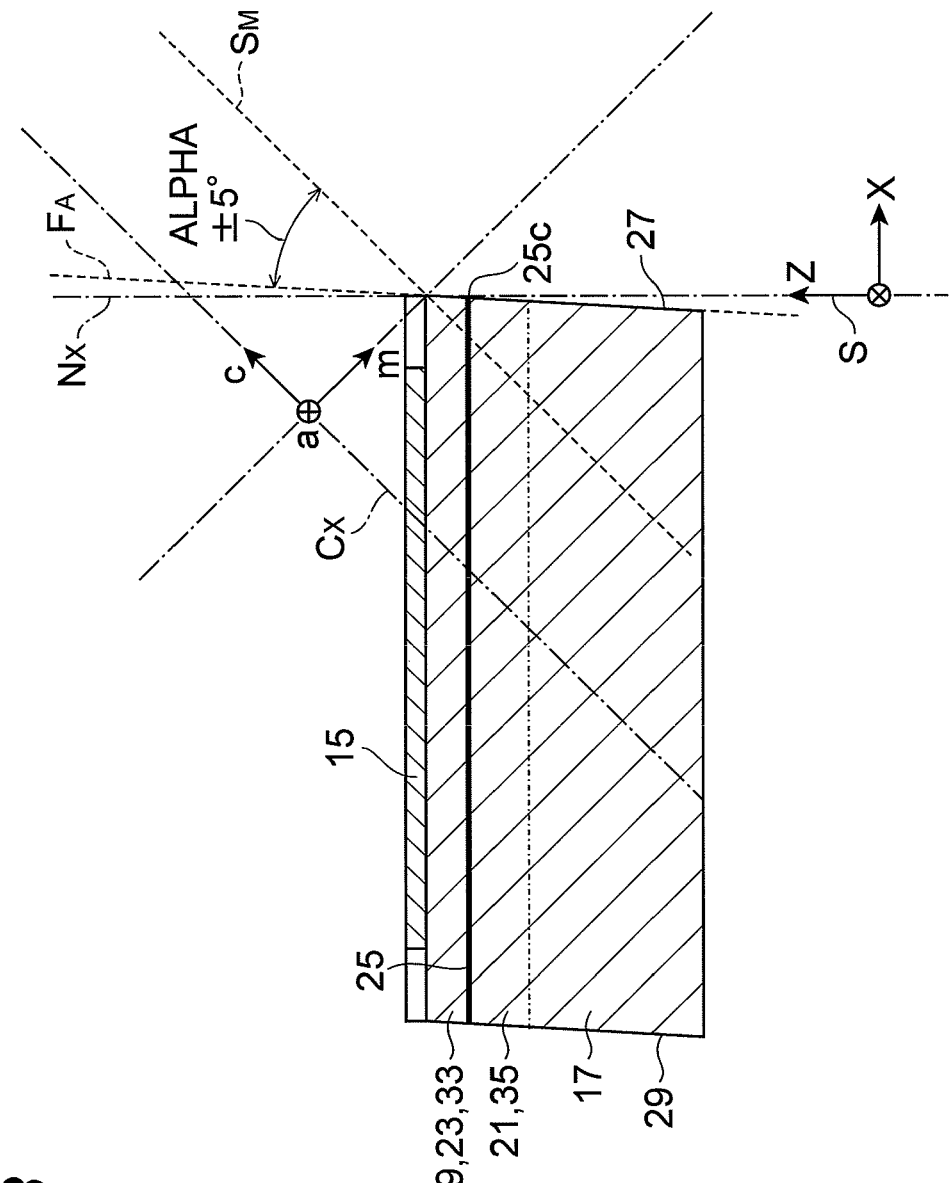
FIG. 3 is a schematic cross-sectional view taken along a plane defined by a c-axis and an m-axis.

FIG. 3 is a schematic view showing a cross-section at a plane defined by the c-axis and the m-axis. Referring to Part (b) of FIG. 2, in the group III nitride semiconductor laser device 11, the end surfaces 17c of the support base 17 and the end surfaces 19c of the semiconductor region 19 are exposed at the fractured faces 27 and 29. The end surfaces 17c and 19c are covered with dielectric multilayers 43 and 44. The angle BETA is defined as an angle formed between the m-axis vector MA of the active layer 25 and the normal vector NA of the end surface 17c of the support base 17 and the end surface 25c of the active layer 25. The angle BETA has a component $(BETA)_1$ on a first plane S1 defined by the c-axis and m-axis of the group III nitride semiconductor and a component $(BETA)_2$ on a second plane S2 defined as a plane orthogonal to the first plane S1 and the normal axis NX, where $BETA^2 = (BETA)_1^2 + (BETA)_2^2$. The component $(BETA)_1$ is preferably within the range of (ALPHA−5) to (ALPHA+5) degrees on the first plane S1 defined by the c-axis and the m-axis of the group III nitride semiconductor. FIG. 3 illustrates the angle ALPHA between a representative m-plane $S_M$ and a reference plane $F_A$. To facilitate understanding, the representative m-plane $S_M$ illustrated in FIG. 3 extends from the inside to the outside of the laser structure. The reference plane $F_A$ extends along the end surface 25c of the active layer 25. The group III nitride semiconductor laser device 11 has an end surface having the above perpendicularity in the angle BETA between the c-axis and the m-axis. The component $(BETA)_2$ is preferably within the range of −5 to +5 degrees on the second plane S2. The end faces 27 and 29 of the group III nitride semiconductor laser device 11 has the above perpendicularity in the angle defined on a plane orthogonal to the normal axis NX of the semi-polar primary surface 17a.

Referring back to FIG. 1, the support base 17 of the group III nitride semiconductor laser device 11 preferably has a thickness DSUB of not more than 400 μm. This is suitable for production of excellent fractured faces for the laser cavity. Even more preferably, the support base 17 of the group III nitride semiconductor laser device 11 has a thickness DSUB within the range of 50 to 100 μm. This is even more suitable for production of excellent fractured faces for the laser cavity. In addition, the ease of handling and the production yield are improved.

In the group III nitride semiconductor laser device 11, the angle ALPHA between the normal axis NX and the c-axis of the hexagonal group III nitride semiconductor is preferably within the range of 45 to 80 degrees, and the angle ALPHA may be within the range of 100 to 135 degrees. If the angle ALPHA is smaller than 45 degrees or larger than 135 degrees, the end surface formed by pressing is likely to contain the m-plane. If the angle ALPHA is between 80 and 100 degrees, desirable flatness and perpendicularity may not be achieved.

In the group III nitride semiconductor laser device 11, the angle ALPHA between the normal axis NX and the c-axis of the hexagonal group III nitride semiconductor is preferably within the range of 63 to 80 degrees, and the angle ALPHA may be within the range of 100 to 117 degrees. If the angle ALPHA is smaller than 63 degrees or larger than 117 degrees, part of the end surface formed by pressing is likely to likely to contain the m-plane. If the angle ALPHA is between 80 and 100 degrees, desirable flatness and perpendicularity may not be achieved.

The semi-polar primary surface 17a may be any one of the (20-21) plane, the (10-11) plane, the (20-2-1) plane, and the (10-1-1) plane. Any plane slightly inclined by an angle in the range of −4 to +4 degrees with respect to the any of these planes is also suitable as a semi-polar primary surface. In these typical semi-polar primary surface 17a, the end faces 27 and 29 can be provided with flatness and perpendicularity sufficient to constitute a laser cavity of the group III nitride semiconductor laser device 11. The end surfaces having a sufficient flatness and perpendicularity are also acquired in any angle in the angle range including these typical plane orientations.

The support base 17 of the group III nitride semiconductor laser device 11 may be composed of any one of GaN, AlN, AlGaN, InGaN, and InAlGaN. The end faces 27 and 29 that are usable as a cavity can be formed on a substrate composed of a gallium nitride-based semiconductor. The use of an AlN or AlGaN substrate increases the polarization degree and enhances optical confinement due to a small refractive index. The use of an InGaN substrate reduces lattice mismatch between the substrate and the light-emitting layer and increases the crystal quality.

Figure 4:
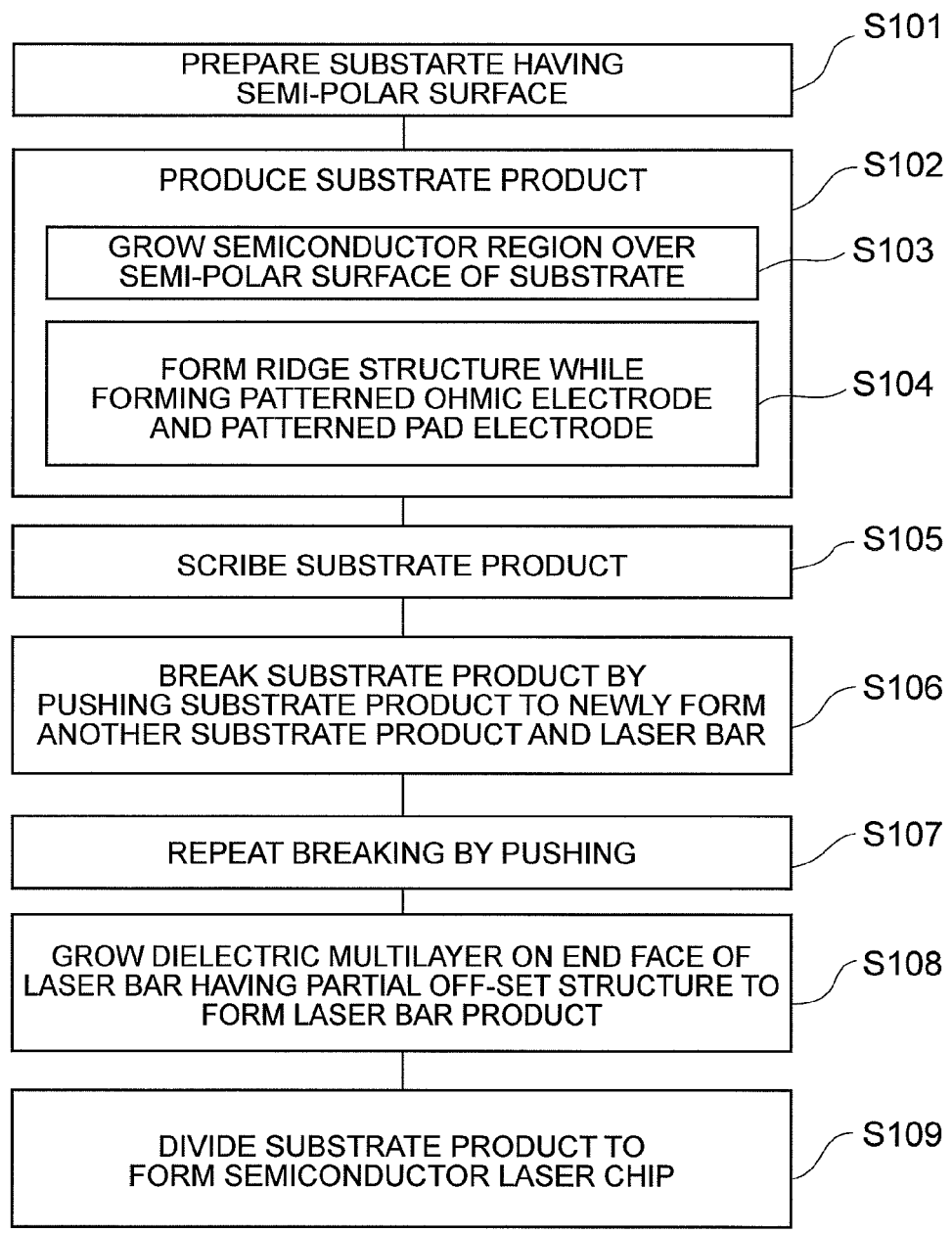
FIG. 4 is a view which illustrates the major steps in a process of producing the group III nitride semiconductor laser device according to an embodiment.
Figure 5:
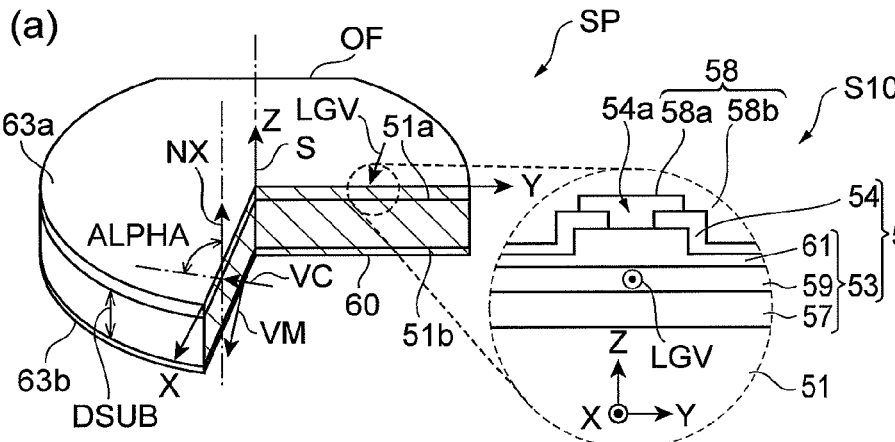
FIG. 5 is a schematic view showing the major steps in a process of producing the group III nitride semiconductor laser device according to an embodiment.
Figure 5:
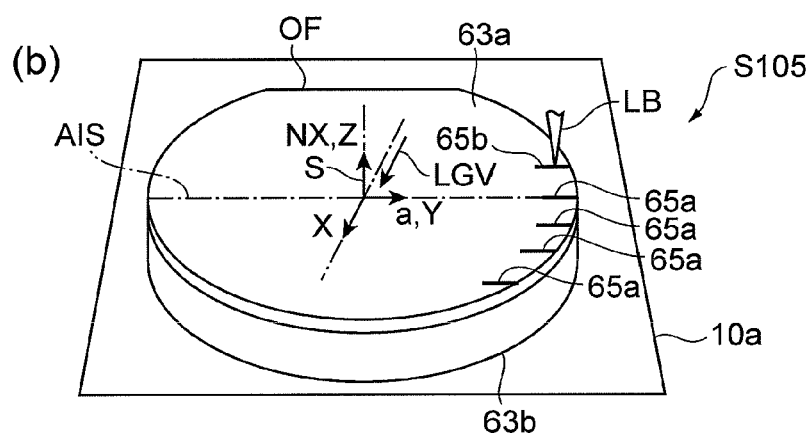
Figure 5:
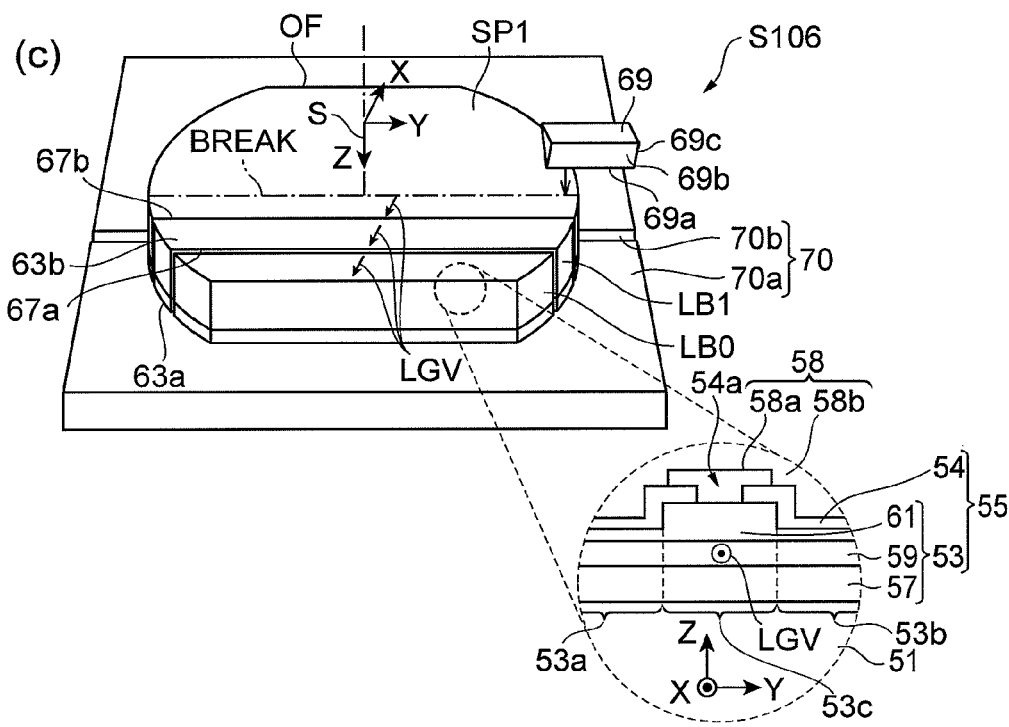

FIG. 4 illustrates the main steps in a process of producing a group III nitride semiconductor laser device according to this embodiment. Part (a) of FIG. 5 illustrates a substrate 51. In Step S101, the substrate 51 for fabricating the group III nitride semiconductor laser device is prepared. The c-axis (vector VC) of the hexagonal group III nitride semiconductor of the substrate 51 is inclined by a finite angle ALPHA with respect to the normal axis NX in the direction of the m-axis (vector VM) of the hexagonal group III nitride semiconductor. Thus, the substrate 51 has a semi-polar primary surface 51a composed of the hexagonal group III nitride semiconductor.

In Step S102, a substrate product SP is formed. Part (a) of FIG. 5 illustrates the substrate product SP as a disc-like member, and the shape of the substrate product SP, however, is not limited thereto. In Step S103, a laser structure 55 for the substrate product SP is formed. The laser structure 55 includes a semiconductor region 53 and a substrate 51. In Step S103, the semiconductor region 53 is formed on the semi-polar primary surface 51a. In order to form the semiconductor region 53, a first-conductivity-type of gallium nitride-based semiconductor region 57, a light-emitting layer 59, and a second-conductivity-type of gallium nitride-based semiconductor region 61 are grown in this order on the semi-polar primary surface 51a. The gallium nitride-based semiconductor region 57 has, for example, an n-type cladding layer, whereas the gallium nitride-based semiconductor region 61 has, for example, a p-type cladding layer. The light-emitting layer 59 is provided between the gallium nitride-based semiconductor region 57 and the gallium nitride-based semiconductor region 61, and may include an active layer, an optical guiding layer, and an electron blocking layer. The gallium nitride-based semiconductor region 57, the light-emitting layer 59, and the gallium nitride-based semiconductor region 61 are arranged in the direction of the normal axis NX of the semi-polar primary surface 51a. These semiconductor layers are epitaxially grown thereon.

If required, a ridge structure may be formed in the semiconductor region 53, and the ridge structure has a striped pattern. In such a case, the subsequent process involves the formation of the ridge structure and also the formation of patterned ohmic electrodes and patterned pad electrodes. The semiconductor region 53 is covered with an insulating layer 54. The insulating layer 54 comprises, for example, a silicon oxide. The insulating layer 54 has an opening 54a. The opening 54a may also be patterned in a stripe shape. A lift-off process may be applied to steps from the formation of the ridge structure to the formation of the insulating layer 54. Subsequently, the patterned ohmic electrodes and the patterned pad electrodes are formed. Specifically, in Step S104, anodes 58 and a cathode 60 are formed on the laser structure 55. Prior to forming the electrodes, the back surface of the substrate 51 used in crystal growth is polished to form the substrate product SP having a predetermined thickness DSUB. In electrode formation, for example, the anodes 58 are formed on the semiconductor region 53, and the cathode 60 is formed on the back surface (polished surface) 51b of the substrate 51. The anode 58 includes an ohmic electrode 58a and a pad electrode 58b, and the ohmic electrode 58a is in contact with the contact layer of the semiconductor region 53 through a corresponding opening 54a in the insulating layer 54. The pad electrode 58b and the ohmic electrode 58a are formed on the insulating layer 54. The anode 58 extends in the direction of the X axis, and the cathode 60 covers the entire back surface 51b. The substrate product SP is formed through these steps. The substrate product SP has a first surface 63a and a second surface 63b opposing the first surface 63a. The semiconductor region 53 is provided between the first surface 63a and the substrate 51.

Figure 6:
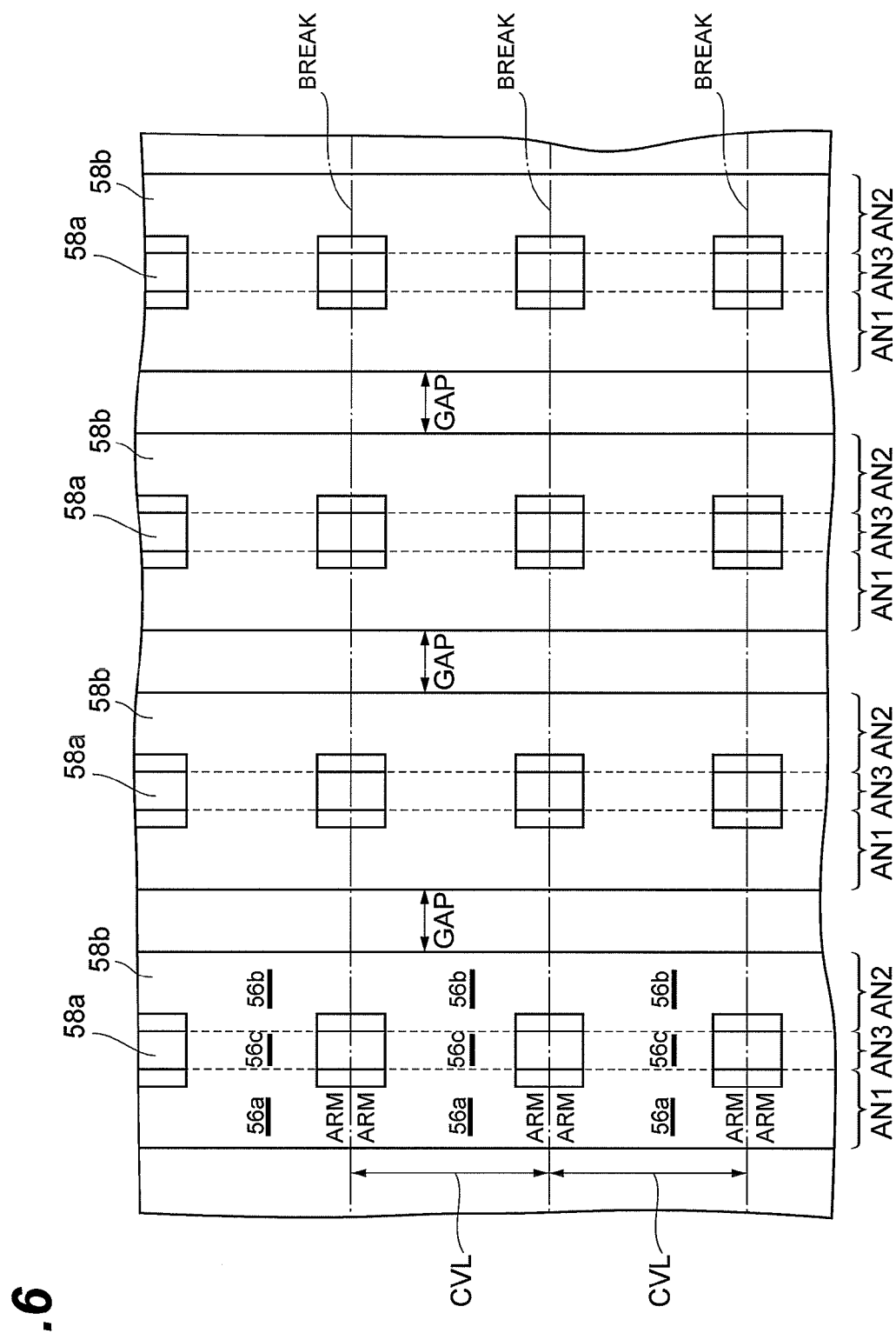
FIG. 6 is a schematic view which illustrates an arrangement of pad electrodes and ohmic electrodes.

The ohmic electrode 58a is composed of, for example, Pd or Ni/Au and is formed through a lift-off process, for example. The pad electrode 58b is composed of, for example, Ti/Au and is formed through a photolithographic process, for example. FIG. 6 illustrates the arrangement of anodes of the substrate product SP and the arrangement of the ridge stripes. As illustrated in FIG. 6, the ohmic electrode 58a has, for example, a striped pattern extending in the direction of a predetermined axis. As illustrated in FIG. 6, the ohmic electrode 58a includes a first electrode portion AN1, a second electrode portion AN2, and a third electrode portion AN3 which are arranged in a direction intersecting the predetermined axis. The first electrode portions AN1 and the second electrode portions AN2 extend in the direction of the predetermined axis. The third electrode portion AN3 is provided between the first electrode portion AN1 and the second electrode portion AN2. The third electrode portion AN3 has a portion provided at predetermined intervals between the first electrode portion AN1 and the second electrode portion AN2, and as the result, openings are formed between the first electrode portions AN1 and the second electrode portions AN2. A first electrode portion AN1, a second electrode portion AN2, and a third electrode portion AN3 located therebetween constitute a stripe conductor. Gaps GAP are provided between such stripe conductors. These stripe conductors extend in the direction of the predetermined axis and are arranged in a direction intersecting the direction of the predetermined axis (intersecting direction) to form gaps GAP therebetween. Each stripe semiconductor has openings arranged at predetermined intervals. These openings in each stripe semiconductor are arranged in the intersecting direction, and lines BREAK are defined so as to extend in the alignment direction of the openings and indicate the cleaving positions. The predetermined intervals are associated with, for example, the length of the laser cavity. Each opening in the stripe semiconductor has, for example, a width of 20 µm and a length of 20 µm.

In Step S105, the first surface 63a of the substrate product SP is scribed, as illustrated in Part (b) of FIG. 5. Scribing is performed with a laser scriber 10a. Scribe grooves 65a are formed by the scribing. Part (b) of FIG. 5 illustrates five scribe grooves that are already formed and a further scribe groove 65b is being formed with a laser beam LB. The scribe grooves 65a are shorter than an intersecting line AIS of the first surface 63a and an a-n plane defined by the a-axis of the hexagonal group III nitride semiconductor and the normal axis NX. Parts of the intersecting line AIS is irradiated with the laser beam LB. As a result of irradiation with the laser beam LB, a groove extending in the predetermined direction in the semiconductor region is formed in the first surface 63a. The scribe grooves 65a may be formed, for example, at the edge of the substrate product SP.

In Step S106, as illustrated in Part (c) of FIG. 5, the second surface 63b of the substrate product SP is pressed to divide the substrate product SP into a substrate product SP1 and a laser bar LB1. The pressing is performed using a breaking device, such as a blade 69. The blade 69 includes an edge 69a, extending in a predetermined direction, and at least two blade surfaces 69b and 69c that define the edge 69a. The pressing of the substrate product SP1 is performed on a support device 70. The support device 70 has a support surface 70a and a recess 70b, which extends in a predetermined direction. The recess 70b is formed in the support surface 70a. The substrate product SP1 is positioned in the recess 70b on the support device 70 such that the orientation and position of the scribe grooves 65a in the substrate product SP1 are aligned with the longitudinal direction of the recess 70b of the support device 70. The edge of the breaking device is aligned with the depression 70b and is pushed against the substrate product SP1 from a direction intersecting with the second surface 63b. The intersecting direction is preferably substantially orthogonal to the second surface 63b. In this way, the substrate product SP is divided into the substrate product SP1 and the laser bar LB1. As a result of the pushing, a laser bar LB1 having a first end face 67a and a second end face 67b are formed. The end faces 67a and 67b have flatness and perpendicularity enabling at least part of the light-emitting layer to be usable as a cavity mirror of a semiconductor laser.

The laser bar LB1 has the end faces 67a and 67b, which are formed in the step described above. The end face 67a and the end face 67b extend from the first surface 63a to the second surface 63b. Thus, the end faces 67a and 67b constitute the laser cavity of the group III nitride semiconductor laser device and intersect the XZ plane. The XZ plane corresponds to the m-n plane defined by the m-axis of the hexagonal group III nitride semiconductor and the normal axis NX. Substrate products are separated at the lines BREAK which are illustrated in FIG. 6. In the end face 67a, the pad electrodes do not reach the end face 67a right above the semiconductor portion defining the laser stripes. In the end face 67b, the pad electrodes dos not extend to the end face 67b right above the semiconductor portion defining the laser stripes.

In this method, as illustrated in FIGS. 5 and 6, the anode 58 includes an ohmic electrode 58a and a pad electrode 58b. The ohmic electrode 58a is in contact with a third region 53d in the semiconductor region through an opening 54a of the insulating layer 54. The pad electrode 58b includes a first electrode portion 56b, a second electrode portion 56c, and a third electrode portion 56d whish are provided on a first region 53b, a second region 53c, and a third region 53d of the semiconductor region 53, respectively. An arm ARM of the first electrode portion 56b extends to the edge of the end face 67a (or the end face 67b) of the group III nitride semiconductor laser device. This allows heat dissipation through the pad electrode 58b in the first region 53b adjoining the third region 53d of the semiconductor region 53. The third region 53d of the semiconductor region 53, which carries out the main lasing operation, extends to the first end face 67a, and the third electrode portion 56d is away from the edge of the first end face 67a. This structure can reduce the occurrence of abnormal growth of dielectric material at the side of the pad electrode 58b at the end face which the third region 53d reaches.

In this method, after the first surface 63a of the substrate product SP is scribed in the direction of the a-axis of the hexagonal group III nitride semiconductor, the substrate product SP is separated into a substrate product SP1 and a laser bar LB1 by pressing against the second surface 63b of the substrate product SP. Thus, the first end face 67a and the second end face 67b are formed in the laser bar LB1 such that they intersect the m-n plane. The end faces 67a and 67b formed through the above method has flatness and perpendicularity sufficient to serve as the laser cavity of the group III nitride semiconductor laser device.

The laser waveguide formed through such a process extends in the inclination direction of the c-axis of the hexagonal group III nitride. Cavity-mirror end faces that can provide the laser waveguide are formed without dry-etched faces.

Through this process, a substrate product SP1 and a laser bar LB1 are newly formed by fracturing the substrate product SP1. In Step S107, repeatedly dividing the substrate product SP1 by pressing produce a number of laser bars. This fracturing is induced at the scribe groove 65a which is shorter than the fracturing line BREAK in the laser bar LB1.

In Step S108, a laser bar product is fabricated by forming dielectric multilayers over the end faces 67a and 67b of the laser bar LB1, which includes pad electrodes having an offset structure. In the end face 67a, the pad electrode does not extend to the end face 67a right above the semiconductor portion that forms the laser stripe, so that abnormal growth on the pad-electrode end faces is alleviated right above the semiconductor portion. Portions of the pad electrode 58b located on both side parts of the semiconductor portion extend to the end face 67a right above these side parts of the semiconductor portion so as to constitute the arms ARM of the pad electrode 58b. These arms ARM dissipate heat that is generated at the semiconductor portion forming the laser stripe. In the end face 67b, the pad electrode 58b does not extend to the end face 67b right above the semiconductor portion that forms the laser stripe. Portions of the pad electrodes 58b located on both side parts of the semiconductor portion extend to the end face 67b right above the side parts of the semiconductor portion so as to constitute the arms ARM of the pad electrode 58b. The arms ARM dissipate heat that is generated at the semiconductor portion forming the laser stripes. In Step S109, the laser bar product is divided into individual semiconductor laser chips.

The substrate 51 may be composed of one of GaN, AlN, AlGaN, InGaN and InAlGaN. A substrate of such a gallium nitride-based semiconductor can provide end faces applicable as a laser cavity. The substrate 51 is preferably composed of GaN.

In Step S104 of forming the substrate product SP, the semiconductor substrate used for crystal growth is processed, for example, by slicing or grounding, such that the substrate thickness becomes 400 μm or smaller, and the second surface 63b may be a processed surface made by polishing. By use of such a substrate thickness, end faces 67a and 67b that have flatness and perpendicularity sufficient for the laser cavity of the group III nitride semiconductor laser device without ion damage can be formed with high yield. The second surface 63b is preferably a polished surface and more preferably the polished substrate has a thickness of 100 μm or smaller. A thickness of 50 μm or greater of the substrate is suitable for relatively easy handling of the substrate product SP.

In the method of forming the laser end faces according to this embodiment, the angle BETA described above with reference to FIG. 2 is also defined in the laser bar LB1. In the laser bar LB1, the component (BETA)$_1$ of the angle BETA is preferably within the range of (ALPHA−5) to (ALPHA+5) degrees on the first plane defined by the c-axis and the m-axis of the group III nitride semiconductor (a plane corresponding to the first plane S1 described with reference to FIG. 2). The end faces 67a and 67b of the laser bar LB1 satisfy the above perpendicularity regarding an angle component of the angle BETA formed between the c-axis and the m-axis. The component (BETA)$_2$ of the angle BETA on a second plane (a plane corresponding to the second plane S2 illustrated in FIG. 2) is preferably within the range of −5 to +5 degrees. The end faces 67a and 67b of the laser bar LB1 satisfy the above perpendicularity regarding an angle component of the angle BETA defined on a plane orthogonal to the normal axis NX of the semi-polar primary surface 51a.

The end faces 67a and 67b are formed by breaking resulting from pressing the gallium nitride-based semiconductor layers which are epitaxially grown on the semi-polar primary surface 51a. The end faces 67a and 67b differ from known cleavage faces which have a low plane index and are used as a cavity mirror, such as the c-plane, the m-plane and the a-plane because they are epitaxial layers stacked over the semi-polar primary surface 51a. Breaking the laminate of the epitaxial layers grown on the semi-polar primary surface 51a forms end faces 67a and 67b having flatness and perpendicularity allowing the application to cavity mirrors.

Example 1

A GaN substrate having a semi-polar surface is prepared and the perpendicularity nature of the fractured face is observed, as described below. A (20-21)-plane GaN substrate is used that is cut out from a thick (0001) GaN ingot grown by HVPE at an angle of 75 degrees toward the m-axis direction away therefrom. The primary surface of the GaN substrate is mirror finished, and the back surface is polished into a pearskin finish. A scribed line is formed on the pearskin back side with a diamond pen in a direction orthogonal to the c-axis projected onto the primary surface of the substrate, and then the substrate is fractured by pressing. The substrate is observed from the direction of the a-plane with a scanning electronic microscope in order to estimate the perpendicularity of the fractured face that has been formed, and this observation has shown that the fractured face has flatness and perpendicularity with respect to the semi-polar primary surface.

Example 2

Figure 7:
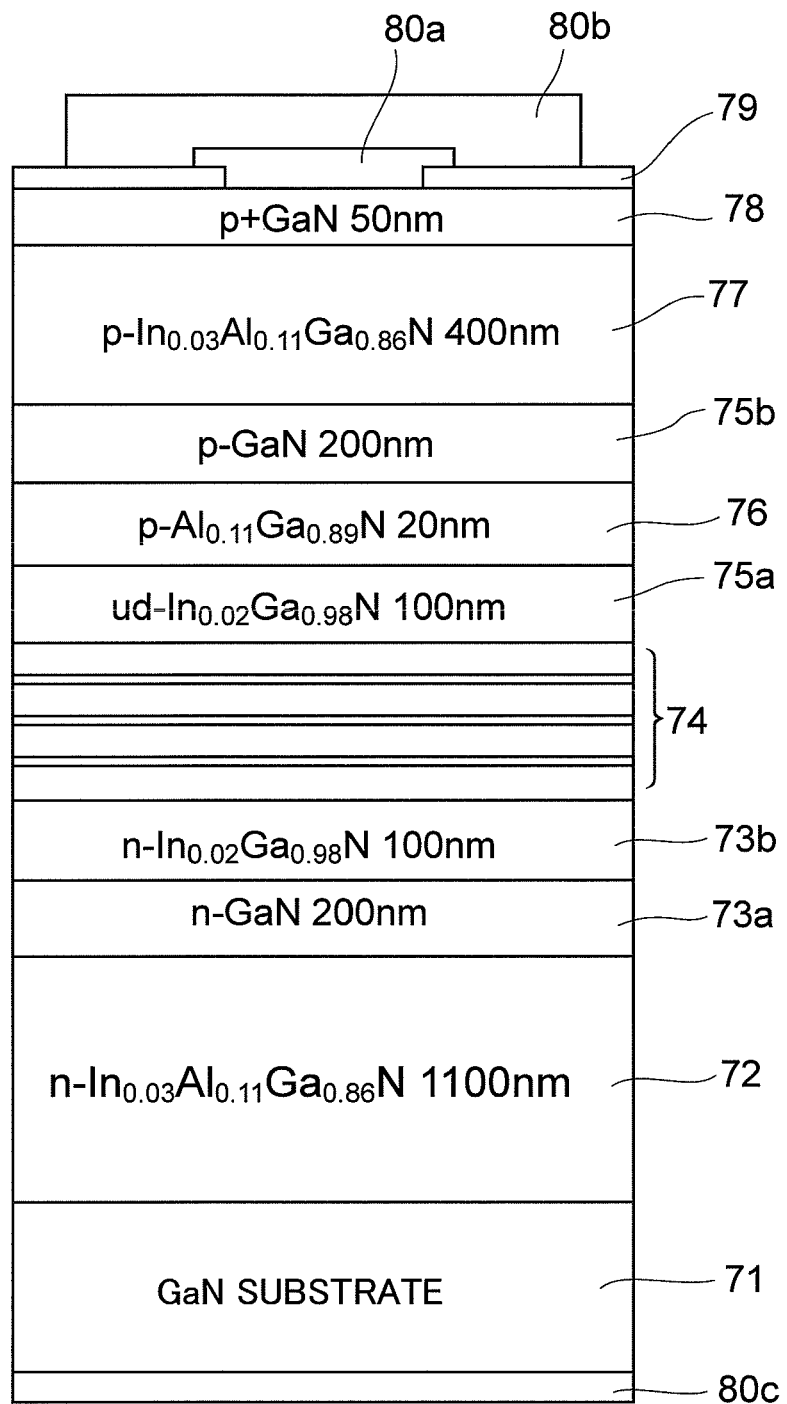
FIG. 7 is a schematic view which illustrates the structure of a laser diode described in Example 2.

Example 1 has shown that, in the GaN substrate having a semi-polar (20-21) plane, the fractured surface obtained by pressing after forming a scribe line orthogonal to the projected c-axis on the primary surface of the substrate has flatness and perpendicularity relative to the primary surface of the substrate. In order to show the usefulness of the fractured face as a laser cavity, a laser diode which is illustrated in FIG. 7 is grown by metal organic chemical vapor deposition. The raw materials used include trimethyl gallium (TMGa), trimethyl aluminum (TMAl), trimethyl indium (TMIn), ammonium ($NH_3$), and silane ($SiH_4$). A substrate 71 is prepared. The substrate 71 is cut out with a wafer slicing apparatus from a thick (0001) GaN ingot grown by HVPE at an angle in the range of zero to 90 degrees formed toward the m-axis direction, so that the GaN substrate that has an inclination angle ALPHA of the c-axis formed toward the m-axis at a desired off-angle in the range of zero to 90 degrees is formed. For example, a (20-21) GaN substrate 71 is prepared by cutting out at a 75-degree angle and is represented by reference numeral 71a in the hexagonal crystal lattice illustrated in Part (a) of FIG. 8.

After the substrate 71 is disposed on a susceptor in a reactor, epitaxial layers are grown in accordance with the growth process described below. An n-type (Si-doped) InAlGaN cladding layer 72 having a thickness of 1100 nm is grown on the substrate 71 at 900 degrees Celsius, where the In content is 0.03 and the Al content is 0.11. An n-type GaN guiding layer 73a having a thickness of 200 nm is grown at 1000 degrees Celsius, and an undoped InGaN guiding layer 73b having a thickness of 100 nm is grown at 870 degrees Celsius, followed by growing a three-period MQW 74. A GaN barrier layer is grown at 840 degrees Celsius, and an InGaN well layer is grown at 740 degrees Celsius. The GaN barrier layer has a thickness of 10 nm. The InGaN well layer has a thickness of 3 nm and an In content of 0.30. An undoped InGaN guiding layer 75a having a thickness of 100 nm is grown at 870 degrees Celsius, and a p-type (Mg-doped) AlGaN blocking layer 76 having a thickness of 20 nm is grown at 890 degrees Celsius. A p-type GaN guiding layer 75b having a thickness of 200 nm is grown at 880 degrees Celsius. A p-type InAlGaN cladding layer 77 having a thickness of 400 nm is grown at 880 degrees Celsius, where the In content is 0.03 and the Al content is 0.11. A p-type GaN contact layer 78 having a thickness of 50 nm is grown at 880 degrees Celsius.

After a $SiO_2$ insulating layer 79 is stacked over the contact layer 78, a striped window having a width of 10 μm is formed therein by photolithographic wet etching. A contact window extending in the direction of the stripes is formed through the two different way a described below. The laser stripe is formed in the M-direction (direction in which the contact window extends along a predetermined plane defined by the c-axis and the m-axis).

After the striped window is formed, p-side electrode 80a of Ni/Au and pad electrode 80b of Ti/Al are evaporated. Then, the back surface of the GaN substrate (GaN wafer) is polished with diamond slurry to form the substrate product with a mirror-finished back surface. The thickness of the substrate product is measured with a contact film-thickness meter. The thickness may be measured by observing the specimen cross-section with a microscope. The microscope may be carried out with an optical microscope or a scanning electronic microscope. An n-side electrode 80c composed of Ti/Al/Ti/Au is evaporated on the back surface (polished surface) of the GaN substrate (GaN wafer).

A laser scriber including a YAG laser of a wavelength of 355 nm is used to produce lasing cavity mirrors for these two different types of laser stripes. The conditions of forming scribe grooves are as follows: a laser optical output of 100 mW; a scanning speed of 5 mm/s. The scribe grooves each has a length of 30 μm, a width of 10 μm, and a depth of 40 μm, for example. The scribe grooves are formed by directly irradiating the epitaxial surface through the openings in the insulating layer of the substrate with a laser beam at a pitch of 800 μm. The length of the cavity is 600 μm.

Figure 8:
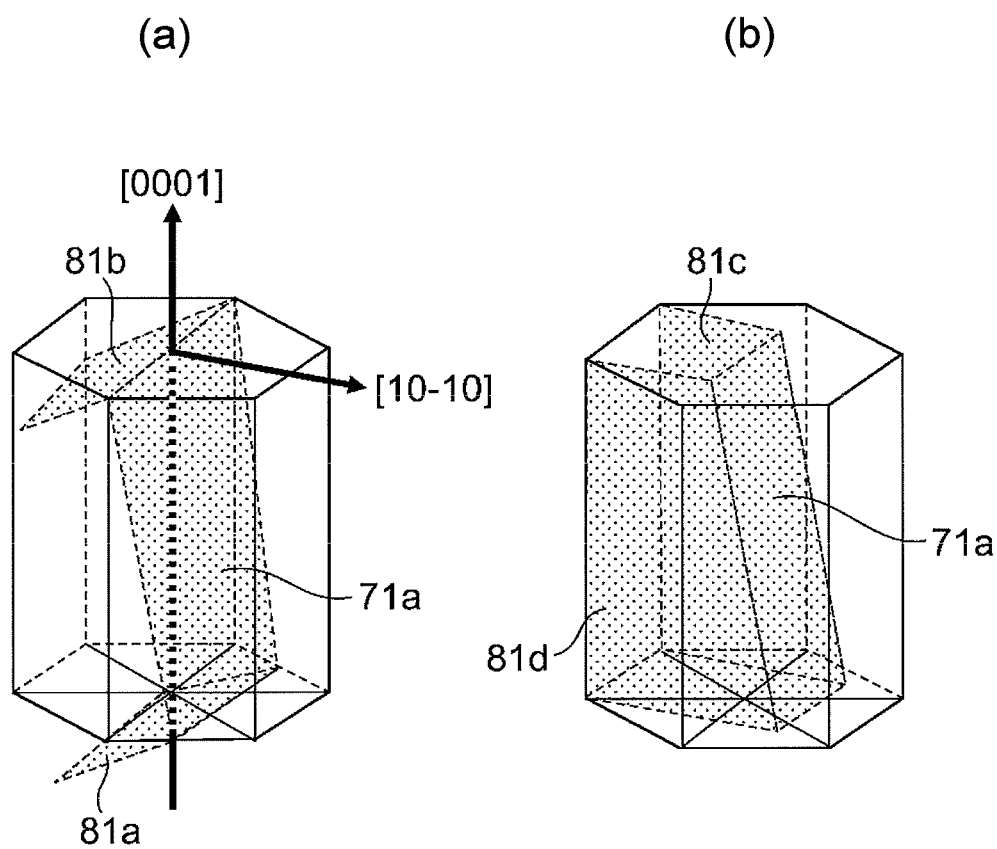
FIG. 8 is a schematic view which illustrates a (20-21) plane and a laser end face in a crystal lattice.

The cavity mirror is produced by fracturing with a blade. A laser bar is produced by pressing and breaking the back side of the substrate. Specifically, parts (a) and (b) of FIG. 8 show that the relationship between the crystal orientation and a fractured face of the GaN substrate having the (20-21) plane. Part (a) of FIG. 8 illustrates the formation of laser stripes extending in the M-direction and illustrates a semi-polar surface 71a and end faces 81a and 81b for the laser cavity. The end faces 81a and 81b are substantially orthogonal to the semi-polar surface 71a and differ from known cleaved faces, such as the c-plane, m-plane, and a-plane. Part (b) of FIG. 8 illustrates laser stripes formed in the (11-20) direction and illustrates the semi-polar surface 71a and end faces 81c and 81d for the laser cavity. The end faces 81c and 81d are substantially orthogonal to the semi-polar surface 71a and consist of a-planes.

Observation with a scanning electronic microscope does not show that the fractured face formed by breaking has significant unevenness. Accordingly, the flatness (magnitude of unevenness) of the fractured face is estimated to be 20 nm or smaller. The fractured face is orthogonal to the specimen surface within the range of −5 to +5 degrees.

The end faces of the laser bar are coated with dielectric multilayers by vacuum deposition. The dielectric multilayers are composed of $SiO_2$ layers and $TiO_2$ layers which are alternately grown. These layers have a thickness of 50 to 100 nm designed such that the center wavelength of reflectance is between 500 and 530 nm. One of the reflective faces is set to a 10-period alternation to be designed reflectance of approximately 95%. The other reflective face is set to a six-period alternation to be a designed reflectance of approximately 80%.

The laser devices are energized at room temperature for evaluation. A pulsed power source having a pulse width of 500 ns and a duty ratio of 0.1% is used to apply the pulses through a needle in contact with the surface electrode. During measurement of the optical output, light emission from the end face of the laser bar is detected by a photodiode to obtain the current versus optical output characteristics (I-L characteristics). In the measurement of wavelength of the emitted light, the spectrum is measured with a spectrum analyzer through an optical fiber transmitting the light emitted from the end face of the laser bar. In the measurement of polarization of the emitted light, the polarization of the light emitted from the laser bar is measured by rotating a polarizing plate. In the observation of light in the LED mode, an optical fiber is aligned with the emission face of the laser bar to measure the light emitted from the emission face.

The laser beams generated by every laser device are confirmed to be polarized in the a-axis direction. The wavelength of the laser beams is in the range of 500 to 530 nm.

The polarization of the laser beams generated by every laser device in the LED mode (spontaneous emission) is measured. The polarization degree ρ is defined as (I1−I2)/(I1+I2), where I1 is the polarization component in the a-axis direction and I2 is the polarization component in the direction of the m-axis projected on the primary surface. Such relationship between the polarization degree ρ and the minimum value of threshold current density indicates that the threshold current density of a laser device of the laser stripe in the M-direction is significantly low when the laser beam is positively polarized. That is, the threshold current density significantly decreases at positive polarization (I1>I2) and with a waveguide disposed in the off direction.

Example 3

Figure 9:
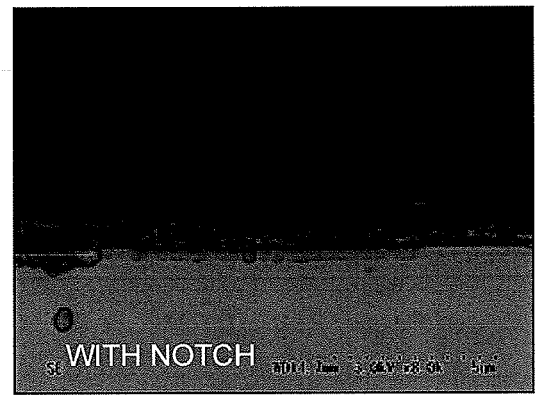
FIG. 9 is a schematic view which illustrates an image captured by a scanning electronic microscope of structures (A) and (B) of a dielectric multilayer grown over a fractured face.
Figure 9:

An epitaxial substrate is fabricated by the procedure described in Example 2, and then, a p-side electrode and an n-side electrode are formed thereon. Two different structures (A) and (B) are prepared for the p-side electrode. Similar to the structure described in the embodiment, structure (A) includes a pad electrode having two arms (hereinafter referred to as "notched structure"). Structure (B) includes a pad electrode the entire edges of which extend along end faces of a cavity (hereinafter referred to as "notchless structure"). Dielectric multilayers of $Al_2O_3/TiO_2$ are grown on the end faces of the pad electrodes in structures (A) and (B). The reflectance of one end face is 90%, and the reflectance of the other end face is 80%. Part (a) of FIG. 9 illustrates a scanning electronic microscope image of a dielectric multilayer grown over a fractured face of a pad electrode in structure (A). Part (b) of FIG. 9 illustrates a scanning electronic microscope image of a dielectric multilayer grown over a fractured face of a pad electrode in structure (B).

Figure 10:
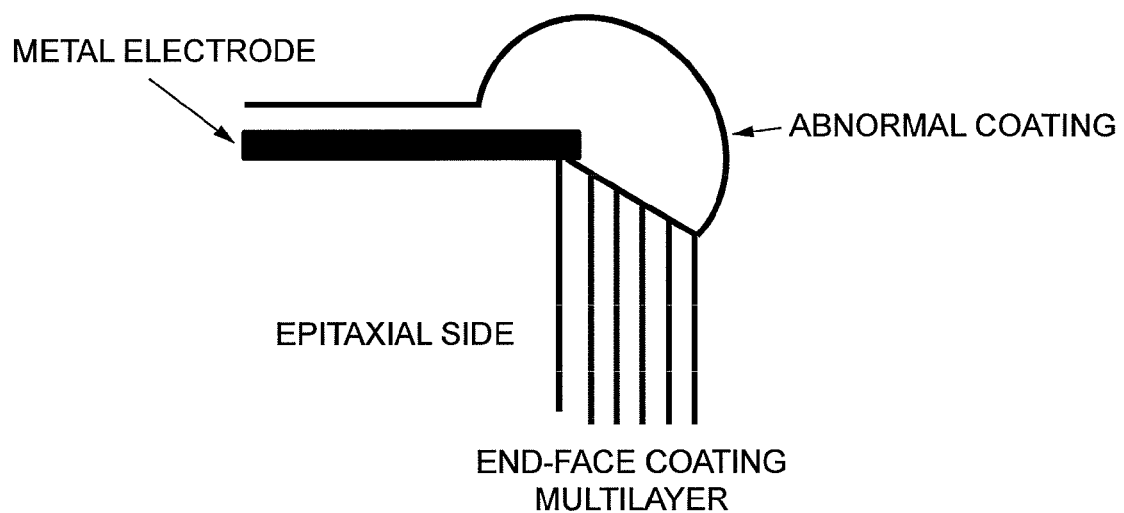
FIG. 10 is a cross-sectional view of a dielectric film grown on a fracture face of a pad electrode on a semiconductor region.

As illustrated in FIG. 10, in structure (B), a dielectric layer is grown on the fracture face of the pad electrode left at the fractured face on the semiconductor region, and abnormal growth is caused in the dielectric layer grown thereon. Due to this abnormal growth, the dielectric film formed on the end face of the laser waveguide does not have a desired reflectance.

In structure (A), the arms of the pad electrode extend to part of an edge of the fractured face, to constitute an end of the pad electrode. In structure (A), the end of the pad electrode at the edge of the fractured face is shorter than that of structure (B). Thus, abnormal growth of the dielectric multilayer occurs less frequently in the pad electrode in structure (A). If the dielectric multilayer of the laser device of structure (B) undergoes abnormal growth, the device does not lase, and, in the process subsequent to the step of forming the dielectric multilayer, the yield of the laser device of structure (B) decreases by 50%, as compared with the laser device of structure (A).

The laser devices of structures (A) and (B) are energized for a life test. The result of the life test shows that the life of the laser device of structure (A) is increased by 200% as compared with the life of the laser device of structure (B).

Figure 11:
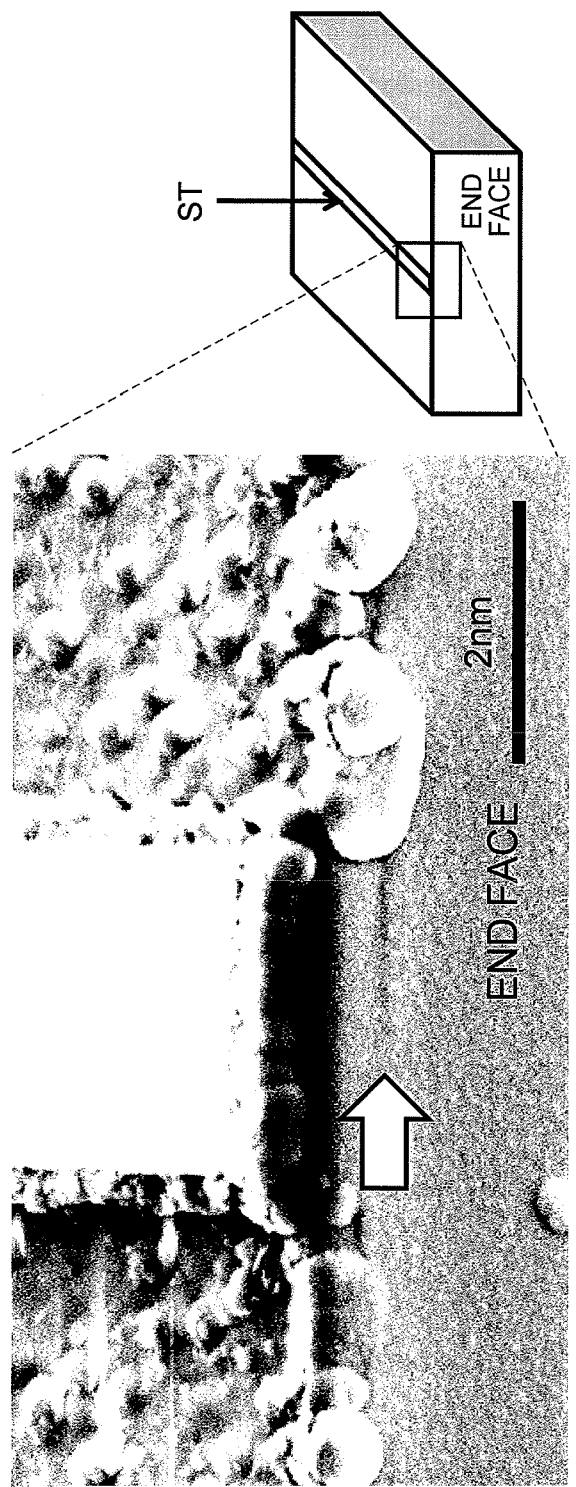
FIG. 11 is a schematic view which illustrates an image of unevenness in a semiconductor region on a fractured face captured by an electronic microscope.

Semi-polarity and abnormal growth of a dielectric multilayer will now be explained below. The inventors have discovered that a step is formed in the fractured face during production of the laser bar of a semiconductor laser device from a substrate having a semi-polar primary surface. Such a step is formed along part of the boundaries of the semiconductor layers in the laser structure. Such unevenness prevents displacement of the fractured face from a direction orthogonal to the waveguide axis and improves the yield of lasing. FIG. 11 illustrates an enlarged view of the end face of a striped electrode ST. The step in the end face is defined by the length in the direction of the primary surface of the substrate and the width in the direction of the waveguide axis. The step with a width greater than 80 nm is likely to cause the generation of heat due to current application at the uneven portion and further results in cracking in the coating on the end face, as illustrated in FIG. 11. The resulting laser device cannot be readily operated. If the laser device includes a pad electrode having a notched structure of partial off-set, structure (A) is particularly advantageous in the use of the semi-polar substrate.

As described above, the present embodiments can provide the group III nitride semiconductor laser device that has a structure enabling reduction in occurrence of malfunctions due to COD and reduction in lowering of heat dissipation capability.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A group III nitride semiconductor laser device comprising:
   a laser structure including a support base and a semiconductor region, the support base having a semi-polar primary surface and comprising a hexagonal group III nitride semiconductor, the semiconductor region being provided on the semi-polar primary surface of the support base, the laser structure having first and second end faces for a laser cavity of the group III nitride semiconductor laser device;
   an insulating layer provided on the semiconductor region of the laser structure;
   an electrode provided on the semiconductor region of the laser structure and the insulating layer; and
   a dielectric multilayer provided on each of the first end face and the second end face;
   a c-axis of the hexagonal group III nitride semiconductor of the support base tilting from a normal axis of the semi-polar primary surface by an angle ALPHA in a direction of a waveguide axis, the waveguide axis extending from the first end face to the second end face,
   the semiconductor region including a first region, a second region, and a third region, the first to third regions extending in the direction of the waveguide axis,
   the third region being provided between the first region and the second region,
   the third region of the semiconductor region including a first cladding layer, a second cladding layer and an active layer, the first cladding layer comprising a first conductivity type gallium nitride-based semiconductor, the second cladding layer comprising a second conductivity type of gallium nitride-based semiconductor, and the active layer provided between the first cladding layer and the second cladding layer,
   the insulating layer having an opening on the third region of the semiconductor region,
   the electrode including an ohmic electrode and a pad electrode,
   the ohmic electrode being in contact with the third region of the semiconductor region through the opening of the insulating layer,
   the pad electrode having a first electrode portion, a second electrode portion and a third electrode portion, the first electrode portion being provided on the first region, the second electrode portion being provided on the second region, and the third electrode portion being provided on the third region,
   the first electrode portion having a first arm, and
   the first arm extending to the first end face, and the third electrode portion being provided away from the first end face,
   wherein the dielectric multilayer is provided on an end face of the first arm,
   wherein the end face of the first arm is contiguous with the first end face of the laser structure.

2. The group III nitride semiconductor laser device according to claim 1, wherein the angle ALPHA is within a range of 45 to 80 degrees or 100 to 135 degrees.

3. The group III nitride semiconductor laser device according to claim 1, wherein
   the laser structure has a first surface and a second surface, the first surface opposing the second surface, and
   the first end face and the second end face extend from an edge of the first face to an edge of the second face.

4. The group III nitride semiconductor laser device according to claim 1, wherein the angle ALPHA is within a range of 63 to 80 degrees or 100 to 117 degrees.

5. The group III nitride semiconductor laser device according to claim 1, wherein the support base has a thickness of not more than 400 μm.

6. The group III nitride semiconductor laser device according to claim 1, wherein the support base has a thickness of 50 to 100 μm.

7. The group III nitride semiconductor laser device according to claim 1, wherein
   the first cladding layer, the second cladding layer, and the active layer are arranged in a direction of the normal axis, and
   the third region of the semiconductor region has a ridge extending in the direction of the waveguide axis.

8. The group III nitride semiconductor laser device according to claim 1, wherein the semi-polar primary surface is inclined from one of a (20-21) plane, a (10-11) plane, a (20-2-1) plane, and a (10-1-1) plane by an angle in a range of −4 to +4 degrees.

9. The group III nitride semiconductor laser device according to claim 1, wherein the semi-polar primary surface comprises one of a (20-21) plane, a (10-11) plane, a (20-2-1) plane, and a (10-1-1) plane.

10. The group III nitride semiconductor laser device according to claim 1, wherein the support base comprises one of GaN, AlGaN, AlN, InGaN, and InAlGaN.

11. The group III nitride semiconductor laser device according to claim 1, wherein
   the active layer includes a gallium nitride-based semiconductor layer, and
   the active layer includes a light-emitting region emitting light having a wavelength of not less than 500 nm.

12. The group III nitride semiconductor laser device according to claim 1, wherein the c-axis of the hexagonal group III nitride semiconductor of the support base tilts toward an m-axis of the hexagonal group III nitride semiconductor.

13. The group III nitride semiconductor laser device according to claim 1, wherein
   an end face of the support base and an end face of the semiconductor region are exposed at each of the first and second end faces, and an angle between an end face of the active layer of the semiconductor region and a reference plane orthogonal to an m-axis of the support base comprising the hexagonal group III nitride semiconductor is in a range of (ALPHA-5) to (ALPHA+5) on a first plane defined by the c-axis and the m-axis of the hexagonal group III nitride semiconductor.

14. The group III nitride semiconductor laser device according to claim 13, wherein the angle is in a range of −5 to +5 degrees on a second plane orthogonal to the first plane and the normal axis.

15. The group III nitride semiconductor laser device according to claim 1, wherein
the second electrode portion has a second arm, and
the second arm extends to an edge of the first end face.

16. The group III nitride semiconductor laser device according to claim 1, wherein the ohmic electrode comprises palladium.

17. The group III nitride semiconductor laser device according to claim 1, wherein the first end face differs from a cleaved face.

18. The group III nitride semiconductor laser device according to claim 1, wherein the end face of the first arm forms a flat surface with the first end face of the laser structure.

19. The group III nitride semiconductor laser device according to claim 1, the first arm having a top surface, wherein the dielectric multilayer is not provided on the top surface of the first arm.

20. The group III nitride semiconductor laser device according to claim 1, wherein the dielectric multilayer forms a planar surface on the end face of the first arm and the first end face of the laser structure.

* * * * *